United States Patent
Ge et al.

(10) Patent No.: US 9,786,777 B2
(45) Date of Patent: Oct. 10, 2017

(54) SEMICONDUCTOR DEVICE AND METHOD OF MAKING SAME

(71) Applicant: Hewlett-Packard Development Company, L.P., Houston, TX (US)

(72) Inventors: Ning Ge, Palo Alto, CA (US); Leong Yap Chia, Singapore (SG); Pin Chin Lee, Singapore (SG); Jose Jehrome Rando, Singapore (SG)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 14/913,980

(22) PCT Filed: Aug. 30, 2013

(86) PCT No.: PCT/US2013/057482
§ 371 (c)(1),
(2) Date: Feb. 23, 2016

(87) PCT Pub. No.: WO2015/030787
PCT Pub. Date: Mar. 5, 2015

(65) Prior Publication Data
US 2016/0204244 A1    Jul. 14, 2016

(51) Int. Cl.
*H01L 21/00* (2006.01)
*H01L 29/74* (2006.01)
(Continued)

(52) U.S. Cl.
CPC ........ *H01L 29/78* (2013.01); *H01L 21/28035* (2013.01); *H01L 21/28123* (2013.01);
(Continued)

(58) Field of Classification Search
CPC ....................................................... H01L 29/78
(Continued)

(56) References Cited

U.S. PATENT DOCUMENTS

| | | | |
|---|---|---|---|
| 5,668,392 A | 9/1997 | Huang et al. | |
| 6,019,457 A * | 2/2000 | Silverbrook | B41J 2/1404 347/62 |

(Continued)

FOREIGN PATENT DOCUMENTS

| | | |
|---|---|---|
| EP | 0692826 A2 | 1/1996 |
| KR | 10-1999-0045409 | 6/1999 |
| KR | 10-2008-0060995 | 7/2008 |

OTHER PUBLICATIONS

Kedzierski et al.; Complementary Silicide Source/Drain Thin-Body MOSFETs for the 20 nm Gate Length Regime; IEEE; Dec. 10-13, 2000; pp. 57-60.
(Continued)

*Primary Examiner* — Calvin Lee
(74) *Attorney, Agent, or Firm* — HP Inc.—Patent Department

(57) ABSTRACT

A semiconductor device and method of forming the same is described. In an example, a polysilicon layer is deposited on a substrate having at least one polysilicon ring. The substrate is doped using the polysilicon layer as a mask to form doped regions in the substrate. A dielectric layer is deposited over the polysilicon layer and the substrate. The dielectric layer is etched to expose portions of the polysilicon layer. A metal layer is deposited on the dielectric layer. The metal layer, the dielectric layer, and the exposed portions of the polysilicon layer are etched such that at least a portion of each polysilicon ring is removed.

6 Claims, 6 Drawing Sheets

(51) Int. Cl.
  *H01L 29/78* (2006.01)
  *H01L 29/66* (2006.01)
  *H01L 21/28* (2006.01)
  *H01L 29/08* (2006.01)
  *H01L 21/8234* (2006.01)

(52) U.S. Cl.
  CPC .. *H01L 21/823481* (2013.01); *H01L 29/0847* (2013.01); *H01L 29/66575* (2013.01); *H01L 29/66659* (2013.01); *H01L 21/823437* (2013.01); *H05K 2203/013* (2013.01)

(58) Field of Classification Search
  USPC .............................. 438/21, 53; 257/127, 419
  See application file for complete search history.

(56) References Cited

U.S. PATENT DOCUMENTS

| | | | |
|---|---|---|---|
| 6,300,181 | B1 | 10/2001 | Patelmo et al. |
| 6,806,108 | B2 * | 10/2004 | Park ................. B41J 2/14137 347/68 |
| 6,838,373 | B2 | 1/2005 | Honeycutt |
| 7,808,037 | B2 | 10/2010 | Chang et al. |
| 9,252,149 | B2 | 2/2016 | Ge et al. |
| 2002/0086491 | A1 | 7/2002 | Kizilyalli |
| 2005/0161744 | A1 | 7/2005 | Frapreau et al. |
| 2005/0212063 | A1 | 9/2005 | Nakano et al. |
| 2005/0231536 | A1 | 10/2005 | Benjamin et al. |
| 2012/0306014 | A1 | 12/2012 | Camillo-Castillo et al. |

OTHER PUBLICATIONS

PCT International Search Report and Written Opinion, May 29, 2014, PCT Application No. PCT/US2013/057482, Korean Intellectual Property Office, 9 pages.

European Patent Office, Extended European Search Report for Appl. No. 13892776.9 dated Feb. 24, 2017 (9 pages).

* cited by examiner

SEMICONDUCTOR DEVICE AND METHOD OF MAKING SAME

CROSS-REFERENCE TO RELATED APPLICATION

This application is a U.S. National Stage Application of and claims priority to International Patent Application No. PCT/US2013/057482, filed on Aug. 30, 2013, and entitled "SEMICONDUCTOR DEVICE AND METHOD OF MAKING SAME," which is hereby incorporated by reference in its entirety.

BACKGROUND

Inkjet technology is widely used for precisely and rapidly dispensing small quantities of fluid. Inkjets eject droplets of fluid out of a nozzle by creating a short pulse of high pressure within a firing chamber. During printing, this ejection process can repeat thousands of times per second. Inkjet printing devices are implemented using semiconductor devices, such as thermal inkjet (TIJ) devices or piezoelectric inkjet (PIJ) devices. For example, a TIJ device is a semiconductor device including a heating element (e.g., resistor) in the firing chamber along with other integrated circuitry. To eject a droplet, an electrical current is passed through the heating element. As the heating element generates heat, a small portion of the fluid within the firing chamber is vaporized. The vapor rapidly expands, forcing a small droplet out of the firing chamber and nozzle. The electrical current is then turned off and the heating element cools. The vapor bubble rapidly collapses, drawing more fluid into the firing chamber.

BRIEF DESCRIPTION OF THE DRAWINGS

Some embodiments of the invention are described with respect to the following figures.

DETAILED DESCRIPTION

Figure 1:
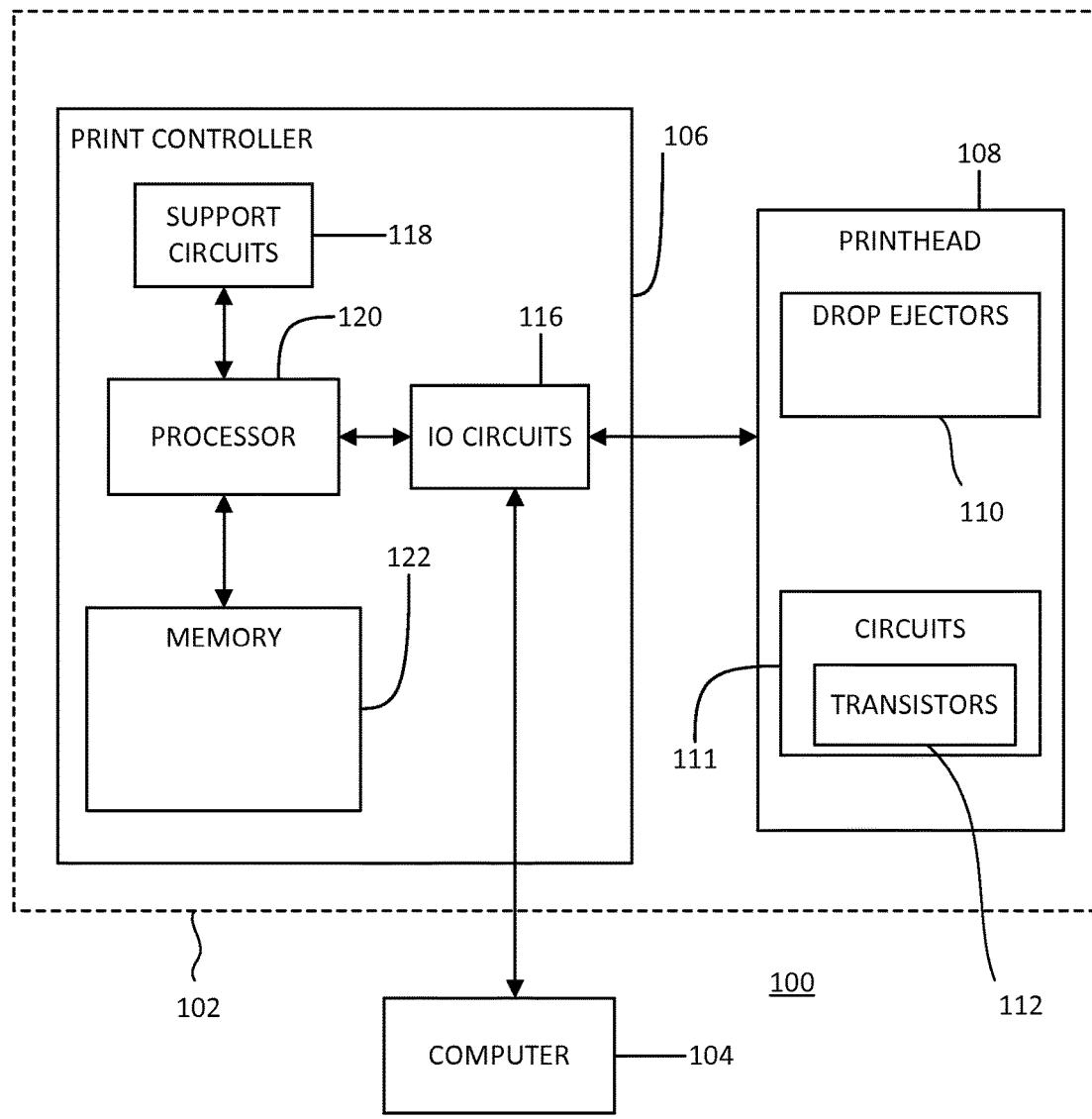
FIG. 1 is a block diagram of an ink jet printer according to an example implementation.

FIG. 1 is a block diagram of an ink jet printer 102 according to an example implementation. The ink jet printer 102 includes a print controller 106 and a printhead 108. The print controller 106 is coupled to the printhead 108. The print controller 106 receives printing data representing an image to be printed to media (media not shown for clarity). The print controller 106 generates signals for activating drop ejectors on the printhead 108 to eject ink onto the media and produce the image. The print controller 106 provides the signals to the printhead 108 based on the printing data.

The print controller 106 includes a processor 120, a memory 122, input/output (IO) circuits 116, and various support circuits 118. The processor 120 can include any type of microprocessor known in the art. The support circuits 118 can include cache, power supplies, clock circuits, data registers, and the like. The memory 122 can include random access memory, read only memory, cache memory, magnetic read/write memory, or the like or any combination of such memory devices. The IO circuits 116 can by coupled to the printhead 108. The IO circuits 116 can also be coupled to external devices, such as a computer 104. For example, the IO circuits 116 can receive printing data from an external device (e.g., the computer 104), and provide signals to the printhead 108 using the IO circuits 116.

The printhead 108 includes a plurality of drop ejectors 110 and associated integrated circuitry 111. The drop ejectors 110 are in fluidic communication with an ink supply (not shown) for receiving ink. For example, ink can be provided from a container. In an example, the printhead 108 is a thermal ink jet (TIJ) device. The drop ejectors 110 generally include a heating element, a firing chamber, and a nozzle. Ink from the ink supply fills the firing chambers. To eject a droplet, an electrical current generated by the circuits 111 is passed through the heater element placed adjacent to the firing chamber. The heating element generated heat, which vaporizes a small portion of the fluid within the firing chamber. The vapor rapidly expands, forcing a small droplet out of the firing chamber and nozzle. The electrical current is then turned off and the resistor cools. The vapor bubble rapidly collapses, drawing more fluid into the firing chamber from the ink supply.

The circuits 111 include various circuit elements and conductors formed as part of an integrated circuitry on the printhead 108. In particular, the circuits 111 include transistors 112 used for various purposes, such as providing signals to the drop ejectors or implementing higher-level circuits, such as logic gates, shift registers, address generators, multiplexers/demultiplexers, on-chip memory, and the like. In some circuits, multiple transistors are laid out in proximity to one another (e.g., a cascade arrangement of transistors). In a standard complementary metal oxide semiconductor (CMOS) process, transistors are isolated from one another using a field oxide (FOX), shallow trench isolation (STI), deep trench isolation (DTI), or the like. Some printheads, however, are manufactured using a no-field oxide process for cost reduction. Since there is no field oxide (or similar feature) isolating individual transistors, the transistors must be laid out with an enclosed gate structure.

For example, in an N-type metal oxide semiconductor (NMOS) no-field oxide process, a gate is formed as a ring on a semiconductor substrate. An inner doped region is formed in the substrate inside the ring and an outer doped region is formed outside the ring separated from the inner doped region by a channel. The inner and outer doped regions act as drain and source of the transistor. If two or more transistors are cascaded and share a common source/drain, additional gate ring(s) must be concentrically arranged on the substrate. This transistor layout is not efficient in terms of area as compared to industry CMOS design having FOX or the like. Further, layout becomes more complicated, requires more semiconductor area, and increases cost. Examples discussed below improve the efficiency of transistor layout in a no-field oxide process by forming transistors using a partially etched gate NMOS transistor process, which requires less semiconductor area for higher packing density and for reduces manufacturing cost. Also, due to the smaller size capacitance, the resulting device exhibits increase electrical speed.

Figure 2A:
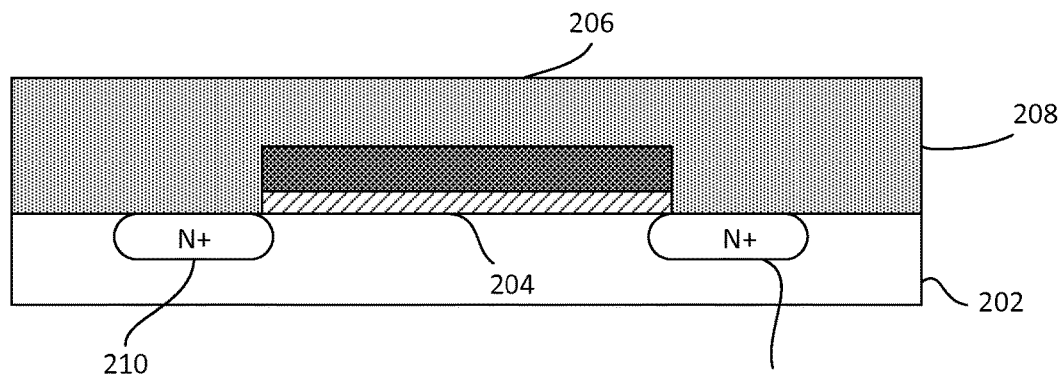
FIGS. 2A through 2C illustrate cross-sections of a semiconductor device according to an example implementation.
Figure 2B:
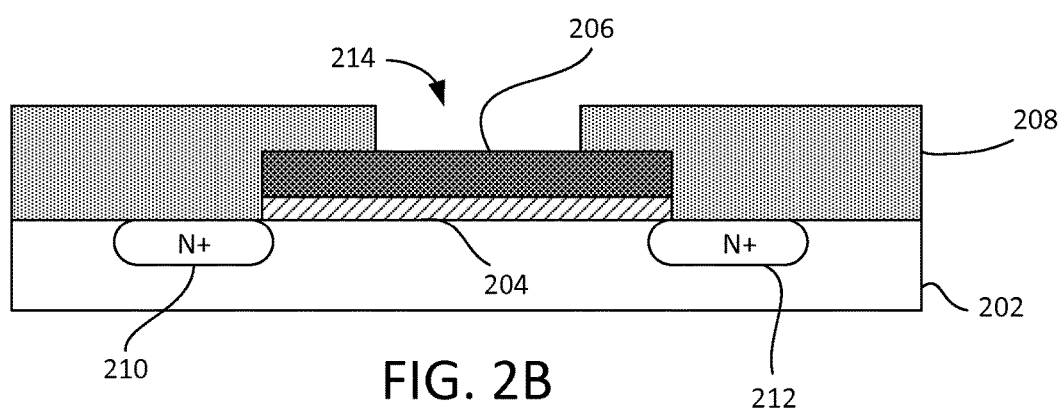
Figure 2C:
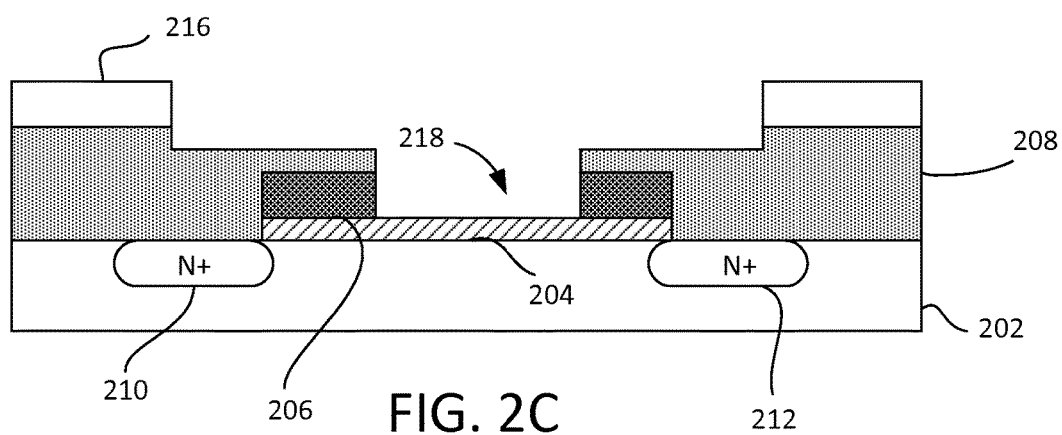

FIGS. 2A through 2C illustrate cross-sections of a semiconductor device according to an example implementation. The cross-sections show the device after different steps of a NMOS transistor process. As shown in FIG. 2A, the device includes a substrate 202 having a gate oxide (GOX) 204 deposited thereon. A polysilicon layer 206 is deposited on the GOX layer 204. The polysilicon layer 206 acts as a hard mask to produce N+ doped regions 210 and 212 in the substrate 202 and the polysilicon layer 206 will be in-situ doped for lower resistance. A dielectric layer 208 is deposited over the polysilicon layer 206. The dielectric layer 208 can be any type of insulator material, such as phosphosilicate glass (PSG) or borophosphosilicate glass (BPSG).

As shown in step FIG. 2B, the dielectric layer 208 is masked using a photolithographic technique, such as use of a contact mask, and etched to produce an exposed portion 214 of the polysilicon layer 206. The etch can be designed to stop at the polysilicon layer 206 using etch control and selectivity techniques.

As shown in FIG. 2C, a metal layer 216 is deposited on the dielectric layer using a mask that covers at least the exposed portion 214 of the polysilicon layer 206. Thus, no metal is deposited on the exposed portion 214 of the polysilicon layer 206. The metal layer 216 is etched to form a conductor pattern. The etching process of the metal layer 216 will also remove the exposed portion 214 of the polysilicon layer 206 and some of the dielectric layer 208 to produce a break 218 in the polysilicon layer 206. This general process, referred to as a partially etched gate NMOS transistor process, can be used to remove unwanted gate portions after doping, as discussed below.

Figure 3A:
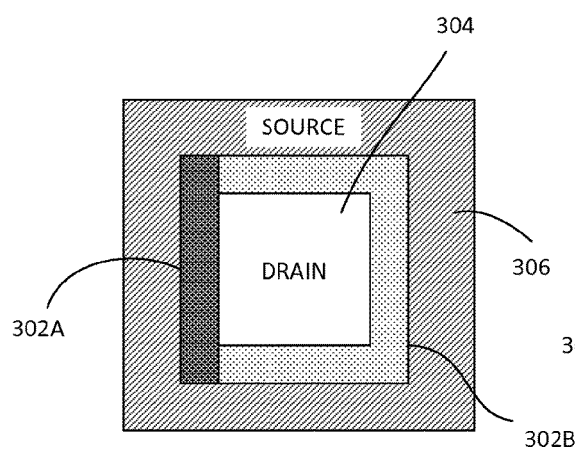
FIGS. 3A and 3B show a top view and cross-section view respectively of a semiconductor device according to an example implementation prior to partial gate etching.
Figure 4A:
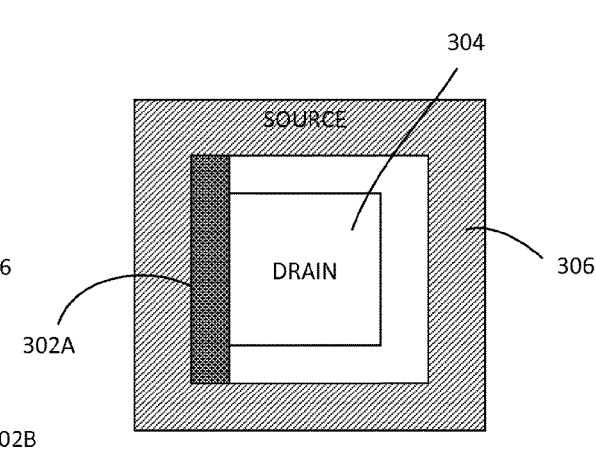
FIGS. 4A and 4B show a top view and cross-section view respectively of a semiconductor device according to an example implementation after partial gate etching.
Figure 3B:
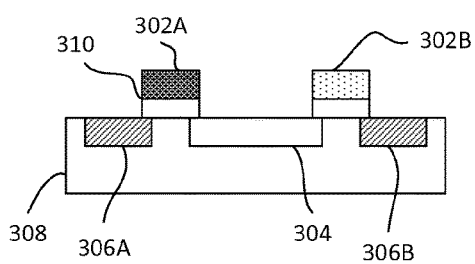
Figure 4B:
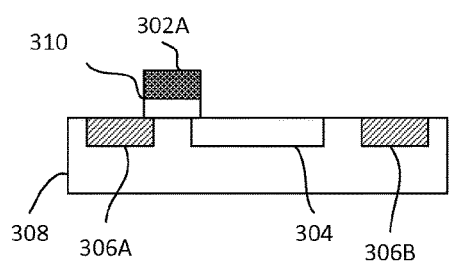

FIGS. 3A and 3B show a top view and cross-section view respectively of a semiconductor device according to an example implementation. The semiconductor device includes a substrate 308 having a GOX layer 310 deposited thereon. A polysilicon layer is formed on the GOX layer 310 having a polysilicon ring 302. The polysilicon ring 302 has a section 302A and a section 302B. Doped regions 304 and 306 are formed in the substrate 308 to provide drain and source for a transistor. In particular, the doped region 306 includes a section 306A and 306B. After the doped regions 304 and 306 are formed, the section 302B can be removed using the process partial-etch process described above in FIG. 2. The resulting transistor structure is shown in FIGS. 4A and 4B.

As shown in FIG. 4, the section 302B is removed. A transistor is formed from the doped region 306A, the section 302A of polysilicon, and the doped region 304 (e.g., source, gate, and drain, respectively). The doped region 304 is isolated from the doped region 306B because the section 302B of polysilicon has been removed (i.e., there is no gate spanning the channel between doped region 304 and doped region 306B). Thus, the gate ring 302 is used to form the doped regions for the transistor (source and drain) and the unwanted portion (e.g., the section 302B) of the polysilicon ring is removed thereafter using the partial-etch process described above. Thus, transistor layouts can be provided to conserve silicon area and cost. When two or more transistors are cascaded, there is no need to build a ring in ring design, as shown below.

Figure 5A:
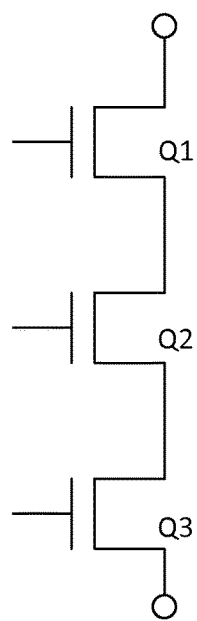
FIG. 5A is a schematic showing a circuit of transistors according to an example implementation.
Figure 5B:
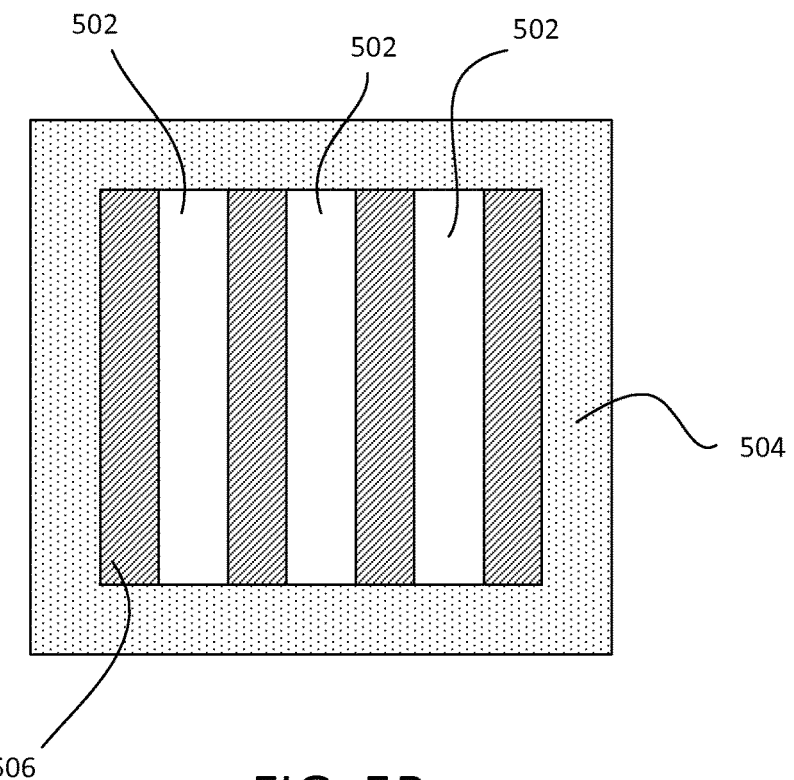
FIG. 5B is a top view of the circuit of FIG. 5 as formed on a substrate prior to partial gate etching according to an example implementation.

FIG. 5A is a schematic showing a circuit 500 of transistors according to an example implementation. The circuit 500 includes three transistors Q1, Q2, and Q3 in a cascade arrangement. FIG. 5B is a top view of the circuit 500 as formed on a substrate prior to partial gate etching according to an example implementation. The layout includes polysilicon gate segments 502 and doped regions 506. A polysilicon ring 504, used when forming the doped regions 506, is removed using the partial etching process described above. In this manner, a ring-in-ring structure is not required to produce a layout of cascaded transistors, saving silicon area and cost.

Figure 6:
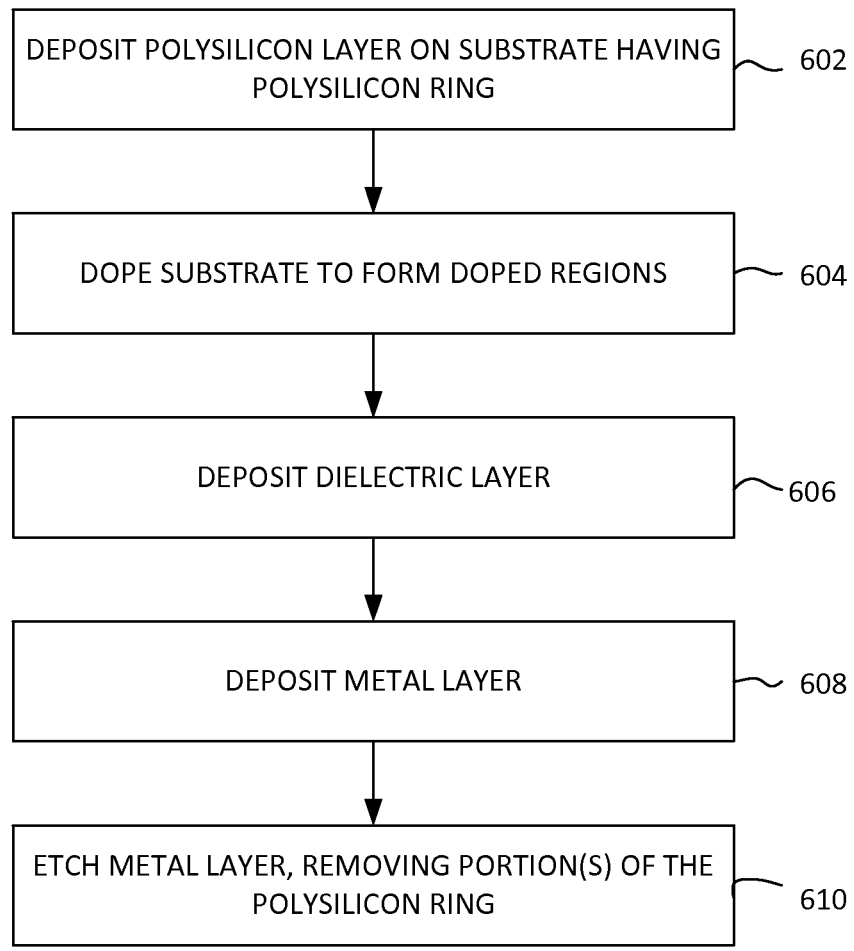
FIG. 6 is a flow diagram of a method of forming a semiconductor device according to an example implementation.

FIG. 6 is a flow diagram of a method 600 of forming a semiconductor device according to an example implementation. The method 600 begins at step 602, where a polysilicon layer is deposited on a substrate having at least one polysilicon ring. At 604, the substrate is doped using the polysilicon layer as a mask to form doped regions in the substrate. At step 606, a dielectric layer is deposited over the polysilicon layer and the substrate. At step 608, the dielectric layer is etched to expose portions of the polysilicon layer. At step 610, a metal layer is deposited over the dielectric layer. In examples, the metal layer is not deposited over at least the exposed portions of the polysilicon layer. At step 612, the metal layer, dielectric layer, and the exposed portions of the polysilicon layer such that at least a portion of the polysilicon ring is removed.

Figure 7:
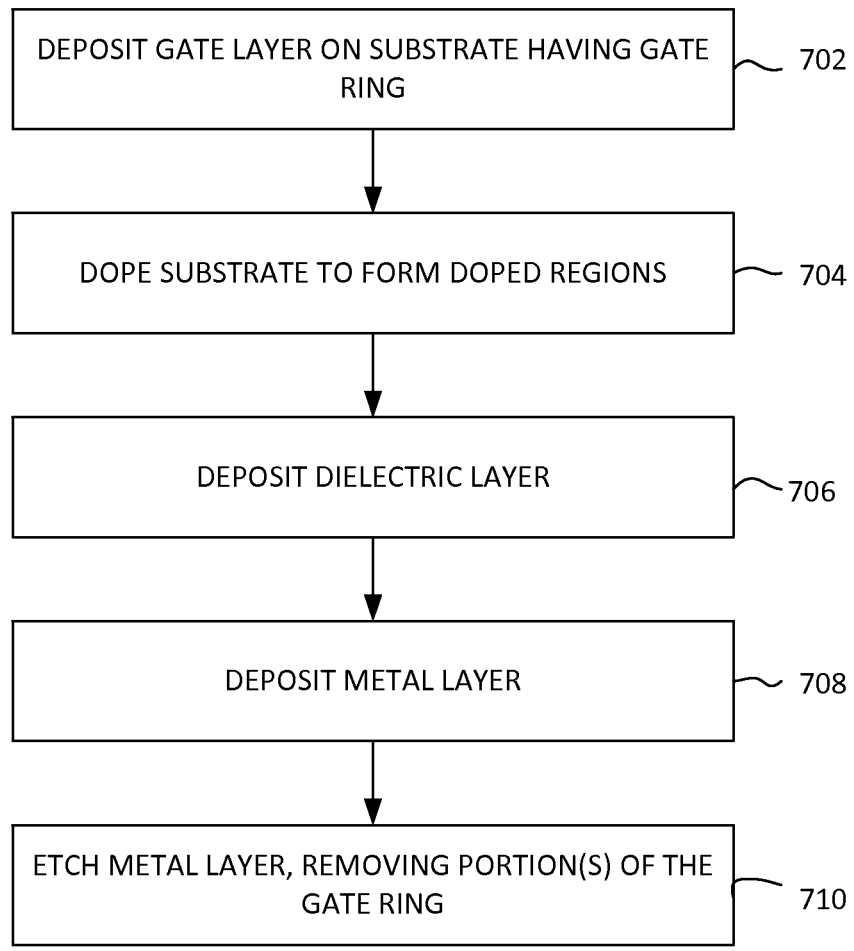
FIG. 7 is a flow diagram of a method of forming transistors in a substrate according to an example implementation.

FIG. 7 is a flow diagram of a method 700 of forming transistors in a substrate according to an example implementation. The method 700 begins at step 702, where a gate layer is formed on the substrate having at least one gate ring. At step 704, the substrate is doped to form source and drain regions. At step 706, a dielectric layer is formed over the gate layer and the substrate. At step 708, the dielectric layer is etched to expose portions of the gate layer. At step 710, a metal layer is deposited on the dielectric layer. In examples, the metal layer is not deposited over at least the exposed gate portions. At step 712, the metal layer, dielectric layer, and the exposed gate portions are etched such that at least a portion of the gate ring is removed.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of forming transistors in a substrate, comprising:
   forming a gate layer having at least one gate ring on the substrate;
   doping the substrate to form doped source and drain regions in the substrate;
   forming a dielectric layer over the gate layer and the substrate;
   etching the dielectric layer to expose portions of the gate layer;
   depositing a metal layer on the dielectric layer; and
   etching the metal layer, the dielectric layer, and the exposed portions of the gate layer such that at least a portion of each gate ring is removed,
   wherein the at least one gate ring includes a first gate ring, and wherein the doping includes forming a drain region surrounded by a source region with a channel therebetween.

2. The method of claim 1, wherein after the etching the metal layer, the dielectric layer, and the exposed portions of the gate layer, the first gate ring spans only a portion of the channel between the source and the drain regions.

3. The method of claim 1, wherein the substrate is a P-type substrate and the source and drain regions are N+ doped regions.

4. A method of forming a semiconductor device, comprising:
- depositing a polysilicon layer having at least one polysilicon ring on a substrate;
- doping the substrate using the polysilicon layer as a mask to form doped regions in the substrate;
- depositing a dielectric layer over the polysilicon layer and the substrate;
- etching the dielectric layer to expose portions of the polysilicon layer;
- depositing a metal layer on the dielectric layer; and
- etching the metal layer, the dielectric layer, and the exposed portions of the polysilicon layer such that at least a portion of each polysilicon ring is removed,
- wherein the at least one polysilicon ring includes a first polysilicon ring, and wherein the doping includes forming a first doped region surrounded by a second doped region and spaced apart from the second doped region.

5. The method of claim 1, wherein after the etching the metal layer, the dielectric layer, and the exposed portions of the polysilicon layer, the first poly silicon ring spans only a portion of space between the first doped region and the second doped region.

6. The method of claim 1, wherein the substrate is a P-type substrate and the doped regions are N+ doped regions.

* * * * *